(12) United States Patent
Baglin

(10) Patent No.: US 7,142,038 B2
(45) Date of Patent: Nov. 28, 2006

(54) SELECTION CIRCUIT

(75) Inventor: Thomas Jean Ludovic Baglin, Rueil (FR)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/176,587

(22) Filed: Jul. 6, 2005

(65) Prior Publication Data

US 2005/0280313 A1  Dec. 22, 2005

Related U.S. Application Data

(63) Continuation of application No. PCT/EP04/00081, filed on Jan. 8, 2004.

(30) Foreign Application Priority Data

Jan. 8, 2003  (EP) ................... 03000268

(51) Int. Cl.
*H03K 17/62* (2006.01)
(52) U.S. Cl. .................. 327/407; 327/408; 327/410; 327/530; 327/545; 307/64
(58) Field of Classification Search ................ 327/407, 327/408, 410, 530, 545; 307/64
See application file for complete search history.

(56) References Cited

U.S. PATENT DOCUMENTS 4,017,779 A  4/1977 McDonald et al.
4,617,473 A * 10/1986 Bingham .................. 307/66
4,654,829 A *  3/1987 Jiang et al. ............ 365/189.03
4,806,789 A *  2/1989 Sakihama et al. .......... 327/437
5,886,561 A *  3/1999 Eitan et al. ................ 327/408

FOREIGN PATENT DOCUMENTS

DE  42 42 552 A1  6/1994
JP  7-170676 A  7/1995

OTHER PUBLICATIONS

Patent Abstracts of Japan, vol. 1995, No. 10 (JP 07170676, Published Jul. 7, 1995).

* cited by examiner

*Primary Examiner*—Quan Tra
*Assistant Examiner*—Khareem E. Almo
(74) *Attorney, Agent, or Firm*—Dickstein, Shapiro, LLP.

(57) ABSTRACT

A selection circuit having a comparator with comparator inputs connected to first and second voltage inputs), respectively, and a comparator output connected to a control input of a first controllable switch and an inverter. The selection circuit also has a second controllable switch having a second control input connected to the inverter. The first voltage input is connectable to a selection circuit output by the first controllable switch and the second voltage input is connectable to the selection circuit output by the second controllable switch. The inverter has a power supply connector connected to the first voltage input and the comparator has a power supply connector connected to the second voltage input.

16 Claims, 2 Drawing Sheets

SELECTION CIRCUIT

CROSS-REFERENCE TO RELATED APPLICATION

This application is a continuation of International Patent Application Serial No. PCT/EP2004/000081, filed Jan. 8, 2004, which published in German on Jul. 29, 2004 as WO 2004/064233, and is incorporated herein by reference in its entirety.

FIELD OF THE INVENTION

The invention relates to a selection circuit and method for operating the selection circuit. For example, the invention can be used for choosing the maximum supply voltage out of a set of supply voltages.

BACKGROUND OF THE INVENTION

The power-up of chips that have several power supply sources is a difficult problem. Indeed, to work correctly any chip needs a minimum supply voltage. When there are several power supply sources with different voltage on each, it is necessary to determine which of these sources can provide a high enough voltage to the chip. Once this decision is taken, a mix of these valid power supply sources can be done to supply the chip. The decision or selection circuit is difficult to design because the decision circuit itself is also not supplied by one constant power supply source but by several and it has to work whatever the values of the voltages on these sources are.

As known from the prior art FIG. 1 shows a solution for a decision circuit which is used to generate a power supply from two power supply sources VDD1 and VDD2. It is based on a feedback loop.

The circuit comprises a comparator CMP with a comparator input 1 connected to a first voltage input IN1 and a comparator input 2 connected to a second voltage input IN2. The first comparator input 1 is applied with the first supply voltage VDD1 while the second comparator input 2 is applied with the second supply voltage VDD2. A first diode D1, which is connected in parallel to a first controllable switch SW1, is connected on the one side to the first voltage input IN1 and on the other side to a circuit output OVDD. A second diode D2, which is connected in parallel to a second controllable switch SW2, is connected on the one side to the second voltage input IN2 and on the other side to the circuit output OVDD. The control input of the first controllable switch is controlled by the output 3 of the comparator CMP. The output 3 of the comparator CMP is also connected to an inverter INV, whereby the output 6 of the inverter INV controls the control input of the second controllable switch SW2. Both power supply connectors 4 and 7 of the comparator CMP and the inverter INV are connected to the output voltage VDD.

The first switch SW1 is conducting, if the first control voltage SWVDD1 is lower than the difference between VDD1−Vt or if the first control voltage SWVDD1 is lower than the difference between VDD−Vt. In this case the first voltage VDD is VDD1. If the first control voltage SWVDD1 is higher than the difference between VDD1−Vt and higher than the difference between VDD−Vt, the first switch SW1 is not conducting and the voltages VDD and VDD1 are independent. The voltage Vt is a constant voltage. In principle this is also valid for the second switch SW2. The second switch SW2 is conducting, if the second control voltage SWVDD2 is lower than the difference between VDD2−Vt or if the second control voltage SWVDD2 is lower than the difference between VDD−Vt. In this case is the output voltage VDD is VDD2. If the second control voltage SWVDD2 is higher than the difference between VDD2−Vt and higher than the difference between VDD−Vt, the second switch SW2 is not conducting and the voltages VDD and VDD2 are independent.

At power-up, the diodes D1 and D2 pull up the node OVDD, which is the output of the circuit, to the voltage VDD equal to the maximum of the three values VDD1−Vdiode, VDD2−Vdiode or 0. The voltage Vdiode is the diode voltage and is equal for both diodes D1 and D2.

If this voltage VDD is lower than the constant voltage Vt, the comparator output 3 and the inverter output 6 will be floating and therefore be undefined. In some cases, this can lead to a large short circuit current. Let's assume for example that the first supply voltage VDD1=Vt+Vdiode, the second supply voltage VDD2=0, the first control voltage, also called comparator output voltage, SWVDD1=0 and also the second control voltage, also called inverter output voltage, SWVDD2=0. The first switch SW1 is conducting and will try to force the voltage VDD=VDD1=Vt+Vdiode on the node OVDD. But because the control voltage SWDVDD2=0 and this is lower than VDD−Vt=VDD1−Vt=Vt Vdiode−Vt, the second switch SW2 is also conducting and will try to force an output voltage VDD=0 on the node OVDD.

In the following, the voltage difference VDD1−Vdiode or the voltage difference VDD2−Vdiode is supposed to be higher than the constant voltage Vt. The stable state of the circuit will be determined. The comparator output 3 will be 0 if the first voltage VDD1 is higher than the second voltage VDD2 and the comparator output 3 will be the maximum voltage if the second voltage VDD2 is higher than the first voltage VDD1. The maximum voltage is the higher value of the two values VDD1−Vdiode or VDD2−Vdiode. The inverter INV, also supplied with the output voltage VDD, will produce a second control voltage SWVDD2, which is the maximum of VDD1−Vdiode and VDD2−Vdiode, if the first control voltage SWVDD1=0. The inverter INV will produce a second control voltage SWVDD2=0 if the first control voltage SWVDD1 is the maximum of VDD1−Vdiode and VDD2−Vdiode. The first control voltage SWVDD1 switches on the first switch SW1, this means the first switch SW1 is conducting, and the second control voltage SWVDD2 switches off the second switch SW2, this means the second switch SW2 is not conducting, when the first voltage VDD1 is higher than the second voltage VDD2. The control voltages SWVDD1 and SWVDD2 switch off the first switch SW1 and switch on the second switch SW2 when the second voltage VDD2 is higher than the first voltage VDD1. The output voltage VDD is then going from max (VDD1, VDD2)−Vdiode to max (VDD1, VDD2). Similarly, the control voltages SWVDD1 and SWVDD2 will either stay on 0 or go up to max (VDD1, VDD2).

This circuit has several drawbacks. It will not function, if the first voltage VDD1 and second voltage VDD2 are lower than Vt+Vdiode. If the first voltage VDD1 and the second voltage VDD2 are lower than Vt+Vdiode, there can be a high short circuit parasitic current.

SUMMARY OF THE INVENTION

An object of the invention is to provide a selection circuit and a method for operating the selection circuit which chooses the maximum supply voltage from two different supply voltages independent of the amount of these supply voltages.

An advantage of the selection circuit and the method for operating the selection circuit is that no short circuit currents can occur.

The selection circuit according to the invention comprises a comparator with comparator inputs connected to a first and a second voltage input and a comparator output connected to a control input of a first controllable switch and an inverter. The selection circuit further comprises a second controllable switch with a second control input connected to the inverter. The first voltage input is connectable to a selection circuit output by means of the first controllable switch and the second voltage input is connectable to the selection circuit output by means of the second controllable switch. The inverter with its power supply connector is connected to the first voltage input and at least the comparator with its power supply connector is connected to the second voltage input.

The method for operating a selection circuit according to the invention comprises the following steps:

A first voltage is applied at the first voltage input and/or a second voltage is applied at the second voltage input.

If the first voltage is higher than the second voltage, a pull down element pulls the output of the comparator down and the first voltage input is connected to the selection circuit output by means of the first controllable switch.

If the first voltage is lower than the second voltage, a further pull down element pulls the output of the inverter down and the second voltage input is connected to the selection circuit output by means of the second controllable switch.

In an embodiment according to the invention the selection circuit further comprises a controllable pull down element connected between the comparator output and a reference potential.

In another embodiment of the invention the selection circuit further comprises a further controllable pull down element connected between the inverter output and the reference potential.

Advantageously in the selection circuit according to the invention the pull down element and the further pull down element are NMOS transistors.

According to a preferred embodiment of the selection circuit the controllable pull down element comprises a control input connected to the first voltage input and can be controlled by a first supply voltage.

According to a another preferred embodiment of the selection circuit the further controllable pull down element comprises a control input connected to the second voltage input and can be controlled by a second supply voltage.

At least in the selection circuit according to the invention the comparator can be an operational amplifier.

BRIEF DESCRIPTION OF THE DRAWINGS

Subsequently, the invention is further explained with the drawings.

DETAILED DESCRIPTION OF PREFERRED EMBODIMENTS OF THE INVENTION

Figure 1:
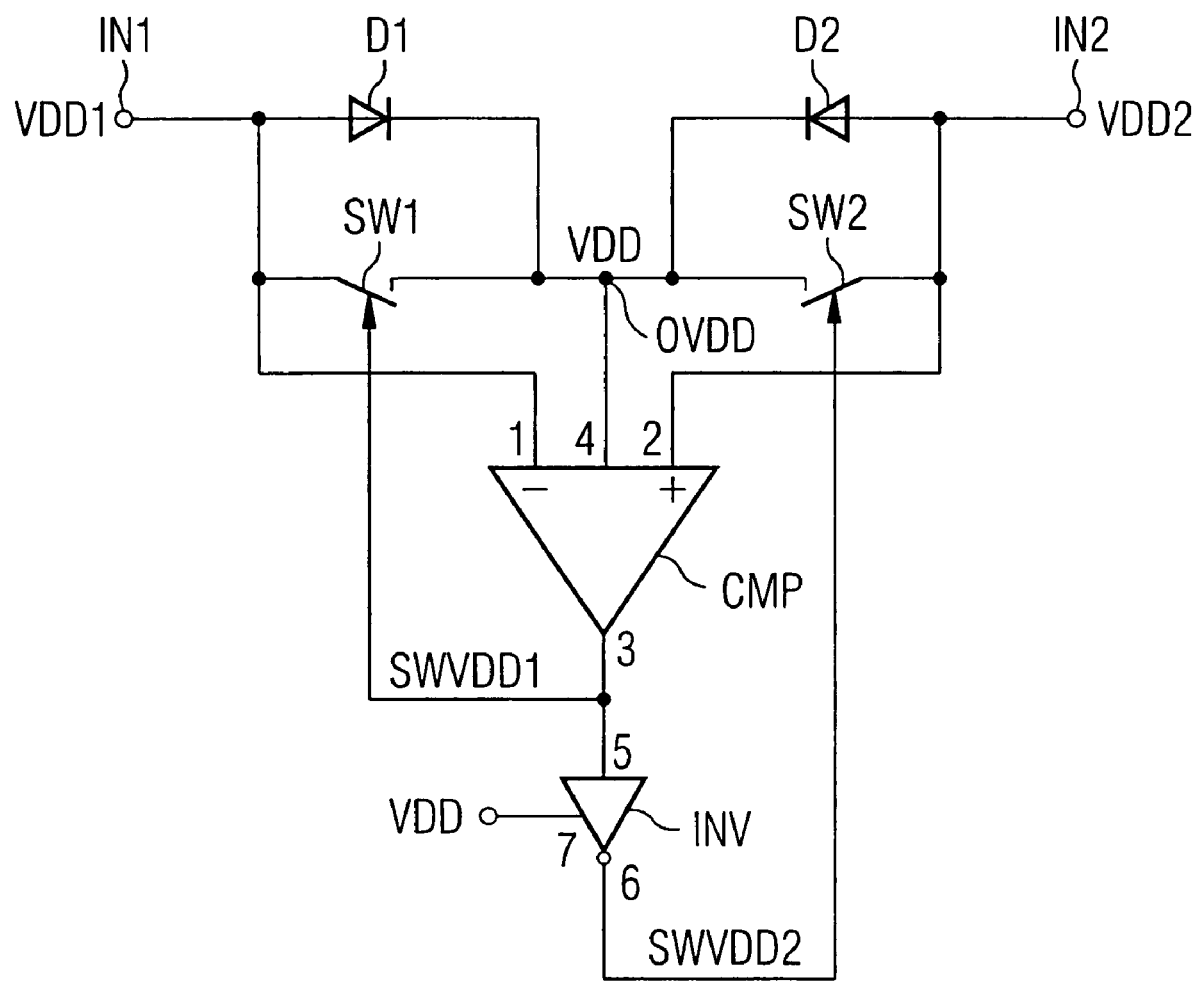
FIG. 1 shows an embodiment of a selection circuit according to the prior art.
Figure 2:
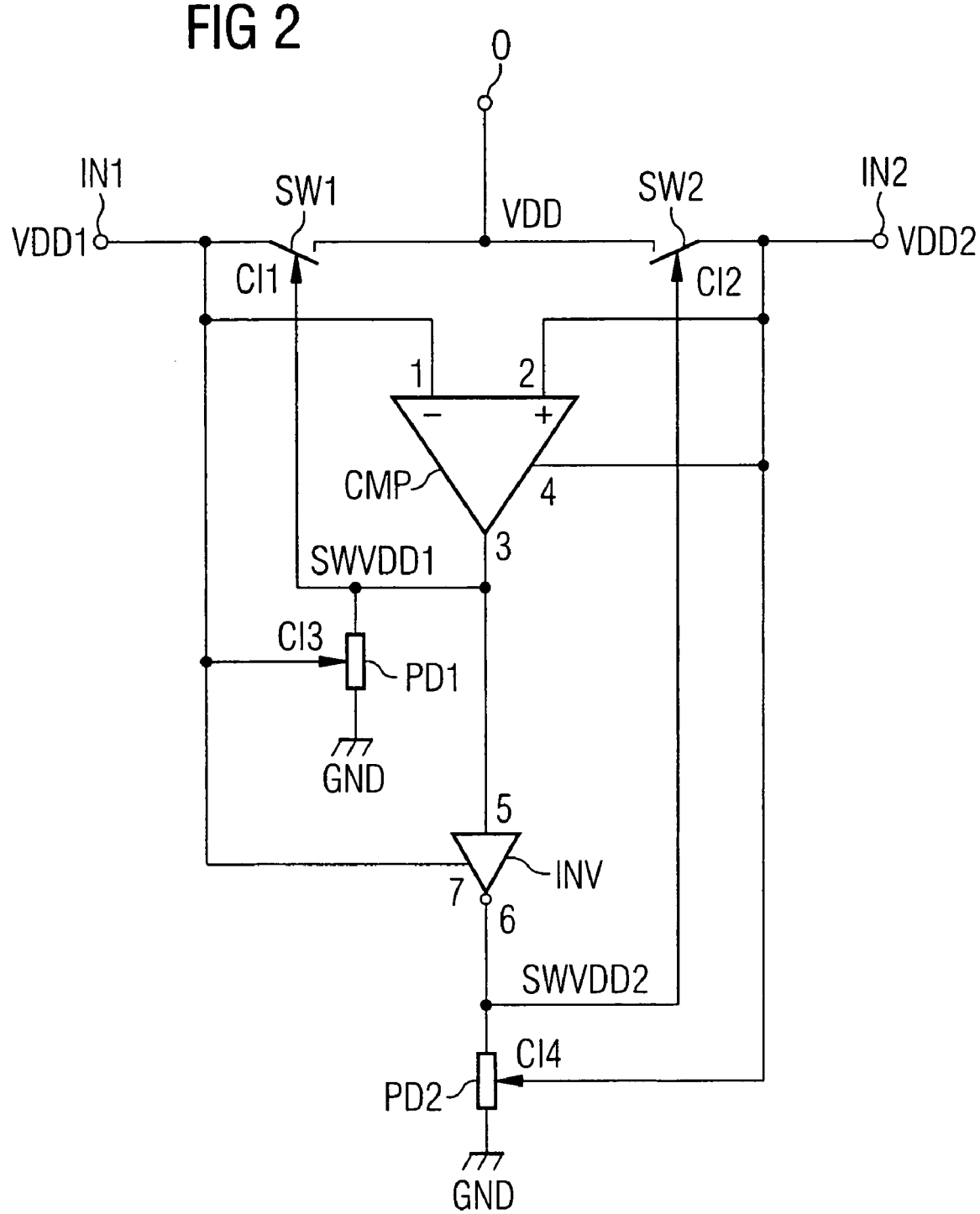
FIG. 2 shows an embodiment of a selection circuit according to the invention.

Contrary to the solution presented above in FIG. 1, the solution according to the invention as shown in FIG. 2 is not based on a feedback loop.

The selection circuit comprises a comparator CMP with a comparator input 1 connected to a first voltage input IN1 and a comparator input 2 connected to a second voltage input IN2. The first comparator input 1 is applied with a first supply voltage VDD1 while the second comparator input 2 is applied with the second supply voltage VDD2 via the voltage inputs IN1 and IN2. A first controllable switch SW1 is connected on the one side to the first voltage input IN1 and on the other side to a circuit output O. A second controllable switch SW2 is connected on the one side to the second voltage input IN2 and on the other side to the circuit output O. The control input CI1 of the first controllable switch SW1 is controlled by the output 3 of the comparator CMP. The output 3 of the comparator CMP is also connected to an inverter INV whereby the output 6 of the inverter INV controls the control input CI2 of the second controllable switch SW2. The power supply connector 4 of the comparator CMP is supplied with the second voltage VDD2 while the power supply connector 7 of the inverter INV is supplied with the first voltage VDD1. The output 3 of the comparator CMP is further connected to a first pull down element PD1, which can be nonlinear. If the voltage at the control input CI3 of the first pull down element PD1 is higher than the voltage Vt, the output 3 of the comparator is pulled down to ground GND by means of the first pull down element PD1. The control input CI3 of the first pull down element PD1 is supplied with the first voltage VDD1. The output 6 of the inverter INV is further connected with a second pull down element PD2, which also can be nonlinear. If the voltage at the control input CI4 of the second pull down element PD2 is higher than the voltage Vt, the output 6 of the inverter INV is pulled down to ground GND by means of the second pull down element PD2. The control input CI4 of the second pull down element PD2 is supplied with the second voltage VDD2.

The pull down elements PD1 and PD2 are preferably transistors and work in the same way. If the voltages at the control inputs CI3 or CI4 of the pull down elements PD1 or PD2 are lower than the voltage Vt, the voltages SWVDD1 or SWVDD2 will be undefined. If the voltages at the pull down elements PD1 or PD2 are floating, the pull down elements can be ignored.

The pull down elements PD1 and PD2 are used to extend the range where the circuit is working. Without them the circuit would work only when the two supply voltages VDD1 and VDD2 are both higher than the voltage Vt. Normally, the first pull down element PD1 is a weak NMOS transistor and the second pull down element PD2 is also a weak NMOS transistor.

When the first supply voltage VDD1 is higher than the voltage Vt and the second supply voltage VDD2 is also higher than the voltage Vt, the pull down elements PD2 and PD1 enter in conflict with the output 3 of the comparator CMP or the output 6 of the inverter INV because both pull down elements PD1 and PD2 try to pull down the control voltages SWVDD1 and SWVDD2 to GND while either the comparator CMP or the inverter INV tries to pull these nodes SWVDD1 and SWVDD2 up to the second supply voltage VDD2 or the first supply voltage VDD1. But as the pull down elements PD2 and PD1 strengths are much lower than the comparator CMP and the inverter INV, it are these lattest which fix the voltages SWVDD1 and SWVDD2.

When the first supply voltage VDD1 is lower than the voltage Vt and the voltage Vt is lower than the second supply voltage VDD2, all the elements using the first power supply VDD1 have their outputs floating. The first pull down element PD1 can be ignored and the inverter output 6 is floating. But thanks to the second pull down element PD2, the node SWVDD2 is pulled down to GND. Therefore the output O is connected to the second supply voltage VDD2 through the switch SW2.

When the second supply voltage VDD2 is lower than the voltage Vt and the voltage Vt is lower than the first supply voltage VDD1, all the elements using the second power supply VDD2 have their outputs floating. The pull down element PD2 can be ignored and the comparator output 3 is floating. But thanks to the first pull down element PD1, the node SWVDD1 is pulled down to GND. Therefore the output O is connected to the first supply voltage VDD1 through the switch SW1.

The switches SW1 and SW2 are preferably transistors and work in the same way. As example, in the following the way of working of the first switch SW1 is described.

The first switch SW1 is conducting, if the first control voltage SWVDD1 is lower than the difference between VDD1-Vt or the first control voltage SWVDD1 is lower than the difference between VDD-Vt. In this case the output voltage VDD is VDD1. If the first control voltage SWVDD1 is higher than difference between VDD1-Vt and higher than difference between VDD-Vt, the first switch SW1 is not conducting and the voltages VDD and VDD1 are independent.

The comparator CMP works as follows. If the voltage VDD2 at the comparator input 2 is higher than the voltage VDD1 at the comparator input 1, the comparator output 3 delivers a first control voltage SWVDD1 which is equal to the second voltage VDD2. If the voltage VDD2 at the comparator input 2 is lower than the voltage VDD1 at the comparator input 1, the comparator output 3 delivers a first control voltage SWVDD1 which is equal to 0. If the second voltage VDD2 is lower than the voltage Vt, the comparator output 3 is floating.

The inverter INV generates a second control voltage SWVDD2=0, if the voltage at its input 5 is VDD2. If the voltage at the input 5 of the inverter INV is 0, the inverter INV generates a second control voltage SWVDD2=VDD1. If the first voltage VDD1, which is the operation voltage of the inverter INV, is lower than the voltage Vt, the inverter output 6 is floating.

There are basically five cases of functioning:

1. The second voltage VDD2 is lower than the constant voltage Vt:

Then the first control voltage SWVDD1 at the comparator output 3 is floating. If the first voltage VDD1 is higher than the constant voltage Vt, then the first pull down element PD1 will pull the first control voltage SWVDD1 to 0 and the output O is connected to the first voltage input IN1.

2. The first voltage VDD1 is lower than the constant voltage Vt:

Then the inverter output 6 is floating. If the second voltage VDD2 is higher than the constant voltage Vt, then the first control voltage SWVDD1 at the comparator output 3 is equal to the second voltage VDD2. The second pull down element PD2 will pull the second control voltage SWVDD2 at the inverter output 6 to 0.

3. The first voltage VDD1 is higher than the second voltage VDD2 and the second voltage VDD2 is higher than the voltage Vt:

The first control voltage SWVDD1 at the comparator output 3 goes to 0 and the second control voltage SWVDD2 at the inverter output 6 adopts the value of the first voltage VDD1.

4. The second voltage VDD2 is higher than the first voltage VDD1 and the first voltage VDD1 is higher than the voltage Vt:

The first control voltage SWVDD1 at the comparator output 3 becomes the second voltage VDD2 and the second control voltage SWVDD2 at the inverter output 6 becomes 0.

5. The first voltage VDD1 is lower than the voltage Vt and the second voltage VDD2 is lower than the voltage Vt:

Then the comparator output 3 and the inverter output 6 will be floating and the output voltage VDD at the circuit output O will be floating.

In all cases, the value of the output voltage VDD is always the maximum of the two voltages VDD1 and VDD2.

By using several selection circuits as shown in FIG. 2, it is possible to choose the maximum supply voltage from a set of different supply voltages V1-Vn, whatever their number n is, thanks to the formula:

$$\max(V1, V2, V3, V4, \ldots) = \max(\ldots \max(\max(\max(V1, V2), V3), V4) \ldots)$$

The advantages of the selection circuit according to the invention are among other things the following.

The selection circuit will work also with low voltages. If the first voltage VDD1 or the second voltage VDD2 is above the voltage Vt, the selection circuit delivers a non floating output voltage VDD at its output O.

Another advantage is the low power consumption of the circuit. In general, the comparator CMP is consuming much more current than the inverter INV. So it is possible to optimize the power consumption on one power supply by connecting it to VDD1.

In all cases, this circuit is faster than the prior art solution as shown in FIG. 1 because it does not rely on a loop and it reaches its final state faster.

Having illustrated and described preferred embodiments for a novel selection circuit, it is noted that variations and modifications in the circuit can be made without departing from the spirit of the invention or the scope of the appended claims.

What is claimed is:

1. A selection circuit, comprising:
   a comparator having comparator inputs connected to first and second voltage inputs, respectively, and a comparator output connected to a first control input of a first controllable switch arid to an inverter;
   a first controllable pull down element connected between the comparator output and a reference potential; and
   a second controllable switch having a second control input connected to the inverter,
   wherein the first voltage input is connectable to a selection circuit output by the first controllable switch, and the second voltage input is connectable to the selection circuit output by the second controllable switch, and
   wherein the inverter has a power supply connector connected to the first voltage input, and the comparator has a power supply connector connected to the second voltage input.

2. The selection circuit according to claim 1, further comprising a second controllable pull down element connected between the inverter output and the reference potential.

3. The selection circuit according to claim 2, wherein the first pull down element and the second pull down element are NMOS transistors.

4. The selection circuit according to claim 1, wherein the first controllable pull down element comprises a control input connected to the first voltage input and can be controlled by a first supply voltage supplied by the first voltage input.

5. The selection circuit according to claim 1, wherein the second controllable pull down element comprises a control input connected to the second voltage input and can be controlled by a second supply voltage supplied by the second voltage input.

6. The selection circuit according to claim 1, wherein the comparator is an operational amplifier.

7. A method for operating a selection circuit according to claim 2, comprising the steps of:
applying a first voltage at the first voltage input and a second voltage at the second voltage input;
if the first voltage is higher than the second voltage, the voltage at the output of the comparator controls the first controllable switch to connect the first voltage input to the selection circuit output; and
if the first voltage is lower than the second voltage, the voltage at the output of the inverter controls the second controllable switch to connect the second voltage input to the selection circuit output.

8. The method according to claim 7, wherein if the first voltage or the second voltage is lower than a minimum voltage, either
the first controllable pull down element pulls the output of the comparator down and the first controllable switch connects the first voltage input to the selection circuit output, or
the second controllable pull down element pulls the output of the inverter down and the second controllable switch connects the second voltage input to the selection circuit output.

9. A selection circuit, comprising:
a comparing means having comparator inputs connected to first and second voltage inputs, respectively, and a comparator output connected to a first control input of a first controllable switching means and to an inverting means;
a first controllable pull down means connected between the comparator output and a reference potential; and
a second controllable switching means having a second control input connected to the inverting means,
wherein the first voltage input is connectable to a selection circuit output by the first controllable switching means, and the second voltage input is connectable to the selection circuit output by the second controllable switching means, and
wherein the inverting means has a power supply connector connected to the first voltage input, and the comparing means has a power supply connector connected to the second voltage input.

10. The selection circuit according to claim 9, further comprising a second controllable pull down means connected between the inverting means output and the reference potential.

11. The selection circuit according to claim 10, wherein the first pull down means and the second pull down means are NMOS transistors.

12. The selection circuit according to claim 9, wherein the first controllable pull down means comprises a control input connected to the first voltage input and can be controlled by a first supply voltage supplied by the first voltage input.

13. The selection circuit according to claim 9, wherein the second controllable pull down means comprises a control input connected to the second voltage input and can be controlled by a second supply voltage supplied by the second voltage input.

14. The selection circuit according to claim 9, wherein the comparing means is an operational amplifier.

15. A method for operating a selection circuit according to claim 10, comprising the steps of:
applying a first voltage at the first voltage input and a second voltage at the second voltage input;
if the first voltage is higher than the second voltage, the voltage at the output of the comparing means controls the first controllable switching means to connect the first voltage input to the selection circuit output; and
if the first voltage is lower than the second voltage, the voltage at the output of the inverting means controls the second controllable switching means to connect the second voltage input to the selection circuit output.

16. The method according to claim 15, wherein if the first voltage or the second voltage is lower than a minimum voltage, either
the first controllable pull down means pulls the output of the comparing means down and the first controllable switching means connects the first voltage input to the selection circuit output, or
the second controllable pull down means pulls the output of the inverting means down and the second controllable switching means connects the second voltage input to the selection circuit output.

* * * * *

UNITED STATES PATENT AND TRADEMARK OFFICE
CERTIFICATE OF CORRECTION

PATENT NO.        : 7,142,038 B2
APPLICATION NO.   : 11/176587
DATED             : November 28, 2006
INVENTOR(S)       : Thomas Baglin It is certified that error appears in the above-identified patent and that said Letters Patent is hereby corrected as shown below:

Column 2, line 28: "Vt30" should read --Vt +--

Column 5, line 1: "it are these lattest" should read --the latter are those--

Column 5, lines 22-23: "the way of working" should read --the working--

Claim 1, column 6, line 54: "arid" should read --and--

Signed and Sealed this

Twentieth Day of February, 2007

JON W. DUDAS
*Director of the United States Patent and Trademark Office*